(12) United States Patent
Izawa et al.

(10) Patent No.: US 10,754,215 B2
(45) Date of Patent: Aug. 25, 2020

(54) ELECTRO-OPTICAL DEVICE AND ELECTRONIC APPARATUS

(71) Applicant: SEIKO EPSON CORPORATION, Tokyo (JP)

(72) Inventors: Shotaro Izawa, Chitose (JP); Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/448,407

(22) Filed: Jun. 21, 2019

(65) Prior Publication Data

US 2019/0391455 A1    Dec. 26, 2019

(30) Foreign Application Priority Data

Jun. 22, 2018    (JP) ................. 2018-118762

(51) Int. Cl.
*G02F 1/1362* (2006.01)
*G02F 1/1368* (2006.01)
*H01L 27/12* (2006.01)
*H01L 29/786* (2006.01)

(52) U.S. Cl.
CPC ...... *G02F 1/136286* (2013.01); *G02F 1/1368* (2013.01); *G02F 1/136227* (2013.01); *H01L 27/124* (2013.01); *H01L 27/1248* (2013.01); *H01L 29/78621* (2013.01); *G02F 1/136209* (2013.01); *G02F 2001/13685* (2013.01); *G02F 2202/104* (2013.01); *H01L 29/78675* (2013.01)

(58) Field of Classification Search
CPC ..... G02F 1/136286; G02F 2001/13629; G02F 2001/136295; G02F 1/1368; G02F 2001/13685; G02F 1/136277; H01L 27/12–1214; H01L 27/124; H01L 27/1244–1251; H01L 29/78621

See application file for complete search history.

(56) References Cited

U.S. PATENT DOCUMENTS

2009/0040447 A1    2/2009    Nakagawa
2010/0033645 A1    2/2010    Nakagawa

FOREIGN PATENT DOCUMENTS

| JP | 2004-170656 A | 6/2004 |
| JP | 2010-008635 A | 1/2010 |
| JP | 2010-039209 A | 2/2010 |
| JP | 2010-039212 A | 2/2010 |
| JP | 2010-117399 A | 5/2010 |
| JP | 2011-146620 A | 7/2011 |
| JP | 2015-215622 A | 12/2015 |

*Primary Examiner* — Sonya McCall-Shepard
(74) *Attorney, Agent, or Firm* — Oliff PLC (57) ABSTRACT

Provided is an electro-optical device including a base material, a signal line, a scanning line, a pixel electrode, a transistor including a gate electrode, a source electrode, and a drain electrode, a first layer having an insulating property and arranged between the pixel electrode and the gate electrode, a second layer having an insulating property and arranged between the pixel electrode and the first layer, a third layer having an insulating property and arranged between the pixel electrode and the second layer, and a wiring including a first portion arranged between the second layer and the third layer and overlapping with the gate electrode in plan view from a thickness direction of the base material, and a second portion arranged closer to the first layer than the first portion and overlapping with an area between the gate electrode and the source electrode or the drain electrode in plan view.

8 Claims, 8 Drawing Sheets

ELECTRO-OPTICAL DEVICE AND ELECTRONIC APPARATUS

The present application is based on, and claims priority from JP Application Serial Number 2018-118762, filed Jun. 22, 2018, the present disclosure of which is hereby incorporated by reference herein in its entirety.

BACKGROUND

1. Technical Field

The present disclosure relates to an electro-optical device and an electronic apparatus.

2. Related Art

There are known electro-optical devices such as a liquid crystal device used in an electronic apparatus such as a projector. For example, the electro-optical device described in JP-A-2010-117399 includes a base material, a data line and a scanning line, a pixel electrode disposed correspondingly to an intersection of the data line and the scanning line, and a thin film transistor arranged on an upper layer side of the scanning line via a first insulating film. Here, the thin film transistor includes a semiconductor film and a gate electrode, wherein the semiconductor film includes a channel area, a data line side source drain area electrically coupled to the data line, and a pixel electrode side source drain area electrically coupled to the pixel electrode, and the gate electrode is formed on the upper layer side of the semiconductor film, and is arranged overlapping with the channel area on the base material, in plan view. The scanning line is arranged overlapping with the semiconductor film on the base material in the plan view, and shields the semiconductor film from light advancing from the upper layer side.

However, in the electro-optical device described in JP-A-2010-117399, the problem arises that, when the scanning line is brought closer to the transistor to enhance the light-shielding effect described above, there is an increase in leakage from the transistor due to an electric field from the scanning line.

SUMMARY

An electro-optical device according to a first aspect of the present disclosure includes a base material, a signal line, a scanning line, a pixel electrode, a transistor including a gate electrode electrically coupled to the scanning line, a source electrode electrically coupled to the signal line, and a drain electrode electrically coupled to the pixel electrode, a first layer having an insulating property and arranged between the pixel electrode and the gate electrode, a second layer having an insulating property and arranged between the pixel electrode and the first layer, a third layer having an insulating property and arranged between the pixel electrode and the second layer, and a wiring including a first portion arranged between the second layer and the third layer and overlapping with the gate electrode in plan view from a thickness direction of the base material, and a second portion arranged closer to the first layer than the first portion and overlapping with an area between the gate electrode and the source electrode or the drain electrode in plan view.

DESCRIPTION OF EXEMPLARY EMBODIMENTS

Hereinafter, preferred exemplary embodiments of the present disclosure will be described with reference to the accompanying drawings. Note that, in the drawings, dimensions and scales of each portion is differed from actual dimensions and scales as appropriate, and some portions are also schematically illustrated to make them easy to be understood. Also note that the scope of the present disclosure is not limited to these embodiments unless otherwise stated to limit the present disclosure in the following descriptions.

Figure 1:
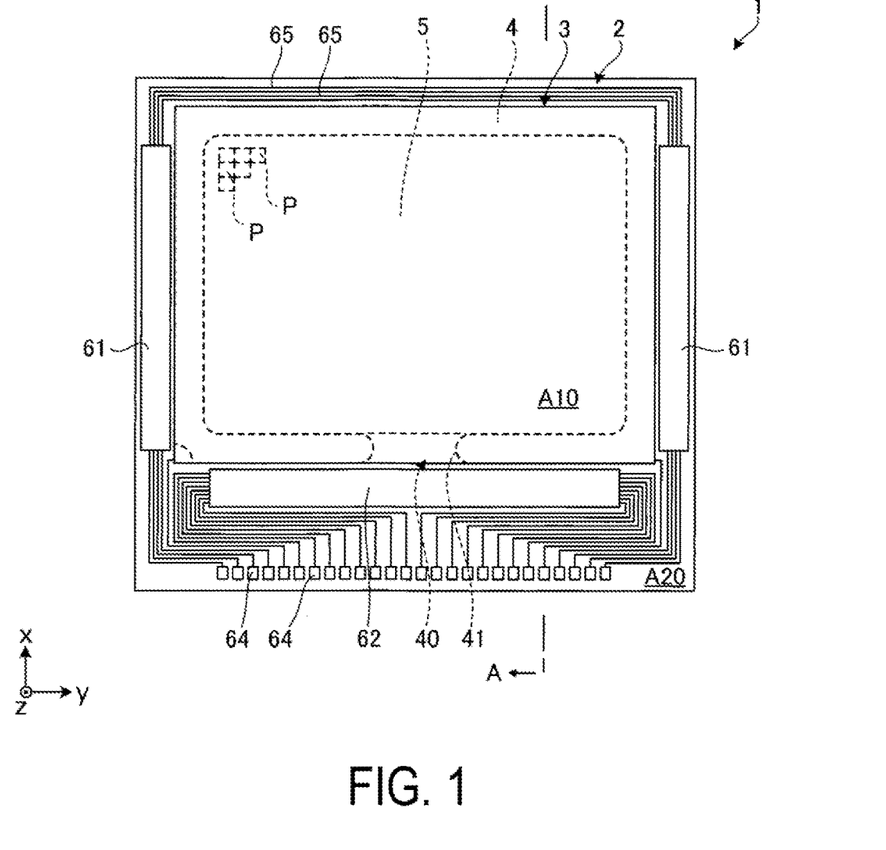
FIG. 1 is a plan view of an electro-optical device according to a first exemplary embodiment.
Figure 2:
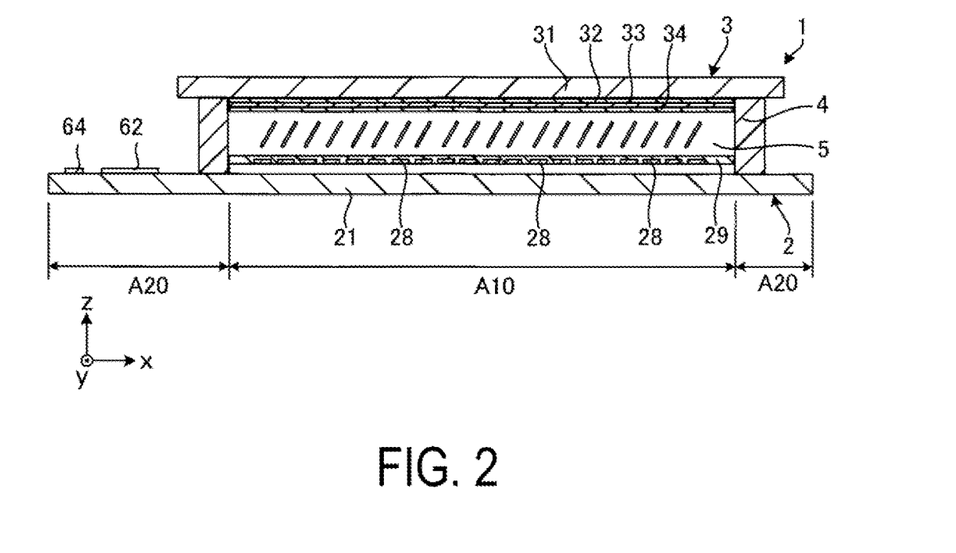
FIG. 2 is a cross-sectional view of the electro-optical device according to the first exemplary embodiment.

1. Electro-Optical Apparatus 1-1. First Exemplary Embodiment
1-1a. Basic Configuration
FIG. 1 is a plan view of an electro-optical device 1 according to a first exemplary embodiment. FIG. 2 is a cross-sectional view of the electro-optical device 1 according to the first exemplary embodiment. The electro-optical device 1 illustrated in FIG. 1 and FIG. 2 is a transmissive active-matrix liquid crystal device that uses a Thin Film Transistor (TFT) as a switching element. A basic configuration of the electro-optical device 1 is described below based on FIG. 1 and FIG. 2. Note that, in the following, for ease of explanation, descriptions are given using the x axis, the y axis, and the z axis, orthogonal to one another and illustrated in FIG. 1 and FIG. 2, as appropriate. Further, FIG. 2 is a cross-sectional view along line A-A in FIG. 1.

The electro-optical device 1 illustrated in FIG. 1 and FIG. 2 includes an element substrate 2 having light transmitting, a counter substrate 3 having light transmitting and arranged facing the element substrate 2, a sealing member 4 having a frame-like shape and arranged between the element substrate 2 and the counter substrate 3, and a liquid crystal layer 5 surrounded by the element substrate 2, the counter substrate 3, and the sealing member 4.

Note that, as illustrated in FIG. 1, the electro-optical device 1 forms a quadrilateral shape in plan view when viewed in a z axis direction parallel with a thickness direction of the element substrate 2, but the shape in the plan view of the electro-optical device 1 is not limited to this shape, and may be a circular shape or the like, for example. Further, in the following, a plan view from the z axis direction parallel with the thickness direction of the element substrate 2 is simply referred to as "plan view".

As illustrated in FIG. 1, the element substrate 2 has a size encompassing the counter substrate 3 in plan view. As illustrated in FIG. 2, the element substrate 2 includes a base material 21, a plurality of pixel electrodes 28, and an alignment film 29. The base material 21 is constituted of a flat plate having light transmitting and an insulating property. The pixel electrodes 28 are respectively formed of a transparent conductive material such as Indium Tin Oxide (ITO) or Indium Zinc Oxide (IZO), for example. The alignment film 29 is positioned closest to the liquid crystal layer 5 in the element substrate 2, and aligns liquid crystal molecules of the liquid crystal layer 5. Examples of the constituent material of the alignment film 29 include polyimide, silicon oxide, and the like.

Further, while not illustrated in FIG. 1 and FIG. 2, a transistor 23, a storage capacitor 20, and the like are arranged between the base material 21 and the pixel electrodes 28. Note that the transistor 23, the storage capacitor 20, and the like will be described in detail later in Section 1-1c, "Detailed Description of Element Substrate 2".

As illustrated in FIG. 2, the counter substrate 3 includes a base material 31, an insulating layer 32, a common electrode 33, and an alignment film 34. The base material 31, the insulating layer 32, the common electrode 33, and the alignment film 34 are aligned in this order. The alignment film 34 is positioned closest to the liquid crystal layer 5.

The base material 31 is constituted of a flat plate having light transmitting and insulating properties. The base material 31 is formed of glass or quartz, for example. The common electrode 33 is stacked on the base material 31 via the insulating layer 32 formed using a light-transmitting insulating material. The common electrode 33 is formed of a transparent conductive material such as ITO or IZO, for example. Further, the alignment film 34 aligns the liquid crystal molecules of the liquid crystal layer 5. Examples of the constituent material of the alignment film 34 include polyimide, silicon oxide, and the like.

The sealing member 4 is formed using an adhesive including various types of curable resins such as epoxy resin, for example. The sealing member 4 is affixed to each of the element substrate 2 and the counter substrate 3. The liquid crystal layer 5 is arranged in a region surrounded by the sealing member 4, the element substrate 2, and the counter substrate 3. Note that an injection port 41 for injecting a liquid crystal material including liquid crystal molecules is formed in a portion of the sealing member 4, and is sealed by a sealing member 40 formed using various resin materials.

The liquid crystal layer 5 includes liquid crystal molecules having positive or negative dielectric anisotropy. The liquid crystal layer 5 is interposed between the element substrate 2 and the counter substrate 3 such that the liquid crystal molecules are in contact with both the alignment film 29 and the alignment film 34. An alignment of the liquid crystal molecules changes in accordance with a voltage applied to the liquid crystal layer 5. By modulating of the light, the liquid crystal layer 5 is allowed to perform gradation display in accordance with the applied voltage.

Further, as illustrated in FIG. 1, two scanning line driving circuits 61 and one signal line driving circuit 62 are arranged on a surface of the element substrate 2, on the counter substrate 3 side. A plurality of external terminals 64 are arranged on the surface of the element substrate 2, on the counter substrate 3 side. The external terminals 64 are coupled with wirings 65 guided from each of the scanning line driving circuits 61 and the signal line driving circuit 62.

Such an electro-optical device 1 overlaps with the liquid crystal layer 5 in plan view, and includes a display area A10 that displays an image and the like, and a peripheral area A20 surrounding the display area A10 in plan view. The display area A10 includes a plurality of pixels P arranged in a matrix pattern. In one pixel P is arranged one pixel electrode 28. The scanning line driving circuits 61, the signal line driving circuit 62, and the like are arranged in the peripheral area A20.

Further, a driving scheme of the electro-optical device 1 may include, but is not specifically limited to, a Twisted Nematic (TN) mode and a Vertical Alignment (VA) mode, for example.

1-1b. Electrical Configuration

Figure 3:
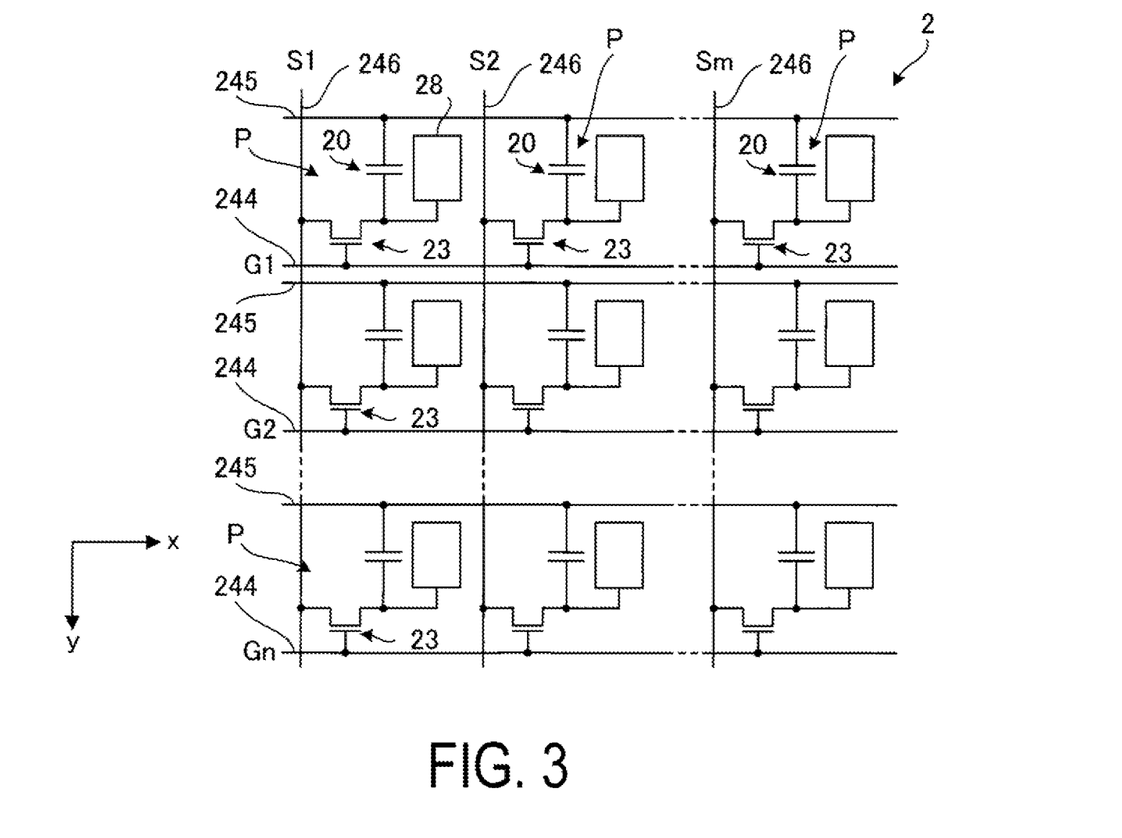
FIG. 3 is an equivalent circuit diagram illustrating an electrical configuration of an element substrate of the first exemplary embodiment.

FIG. 3 is an equivalent circuit diagram illustrating an electrical configuration of the element substrate 2 of the first exemplary embodiment. As illustrated in FIG. 3, on the element substrate 2 are formed n scanning lines 244, m signal lines 246, and n capacitance lines 245. Note that both n and m are integers of 2 or more. The transistor 23 serving as a switching element is arranged correspondingly to each of the intersections between the n scanning lines 244 and the m signal lines 246.

The n scanning lines 244 illustrated in FIG. 3 are aligned at equal intervals in the y axis direction, and extend in the x axis direction. The scanning line 244 is electrically coupled to the transistor 23. Further, the n scanning lines 244 are electrically coupled to the scanning line driving circuits 61 illustrated in FIG. 1. On the n scanning lines 244, scanning signals G1, G2, . . . , Gn are line-sequentially supplied from the scanning line driving circuits 61 to the n scanning lines 244.

The m signal lines 246 illustrated in FIG. 3 are aligned at equal intervals in the x axis direction, and extend in the y axis direction. The signal line 246 is electrically coupled to the transistor 23. Further, the m signal lines 246 are electrically coupled to the signal line driving circuit 62 illustrated in FIG. 1. On the m signal lines 246, image signals S1, S2, . . . , Sm are line-sequentially supplied from the signal line driving circuit 62 illustrated in FIG. 1 to the signal lines 246.

The n scanning lines 244 and the m signal lines 246 are mutually insulated, and form a lattice-like shape in plan view. An area surrounded by two adjacent scanning lines 244 and two adjacent signal lines 246 corresponds to the pixel P. In one pixel P is formed one pixel electrode 28. Note that the transistor 23 is electrically coupled to the pixel electrode 28.

The n capacitance lines 245 are aligned at equal intervals in the y axis direction, and extend in the x axis direction. Further, the n capacitance lines 245 are insulated from the plurality of signal lines 246 and the plurality of scanning lines 244, and are formed apart from these lines. A fixed potential such as a ground potential, for example, is applied to the capacitance lines 245. In addition, the storage capacitor 20 is arranged in parallel with a liquid crystal capacitor, between the capacitance line 245 and the pixel electrode 28, to prevent leakage of charges held in the liquid crystal capacitor.

The scanning signals G1, G2, . . . , Gn become sequentially active and n scanning lines 244 are sequentially selected, then the transistor 23 coupled to the selected scanning line 244 is turned to an on-state. Then, the image signals S1, S2, . . . , Sm having magnitudes commensurate with the gradation to be displayed are transmitted, via the m signal lines 246, to the pixel P corresponding to the selected scanning line 244, and are then applied to the pixel electrodes 28. According to this, a voltage in accordance with the gradation to be displayed to be applied to the liquid crystal capacitor formed between the pixel electrode 28 and the common electrode 33 of the counter substrate 3 illustrated in FIG. 2, and the alignment of the liquid crystal molecules varies in accordance with the applied voltage. Further, the applied voltage is held by the storage capacitor 20. Such a variation in the alignment of the liquid crystal molecules causes the light to be modulated, to thus enable gradation display.

1-1c. Detailed Description of Element Substrate

Figure 4:
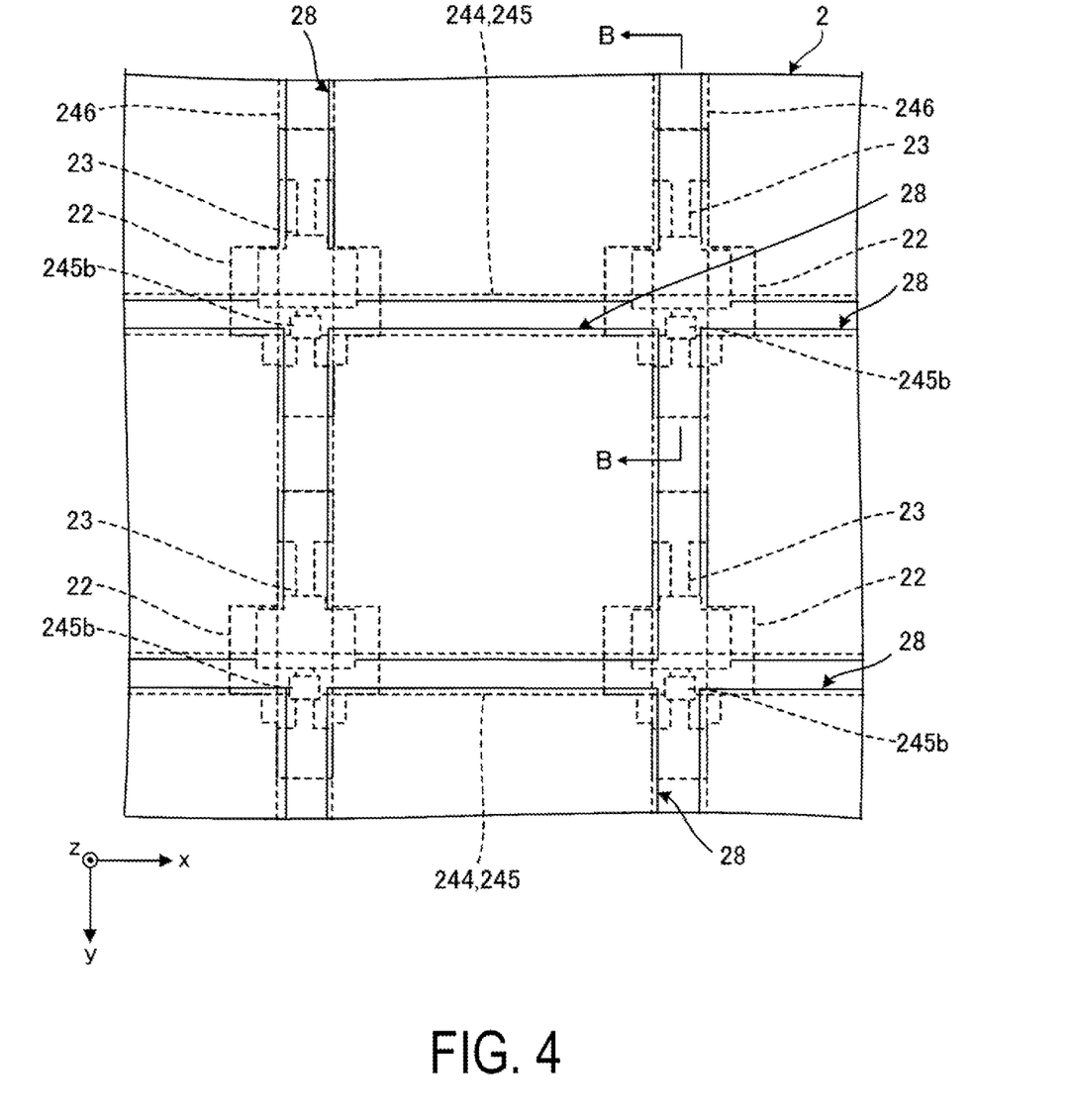
FIG. 4 is a plan view illustrating a portion of the element substrate of the first exemplary embodiment.

FIG. 4 is a plan view illustrating a portion of the element substrate 2 of the first exemplary embodiment. Further, as illustrated in FIG. 4, in the element substrate 2, the transistor 23 is arranged overlapping at an intersection portion where the signal line 246 and the scanning line 244 intersect in plan view. Note that, while not illustrated in FIG. 4, the storage capacitor 20 is also arranged overlapping at the intersection portion in plan view.

Figure 5:
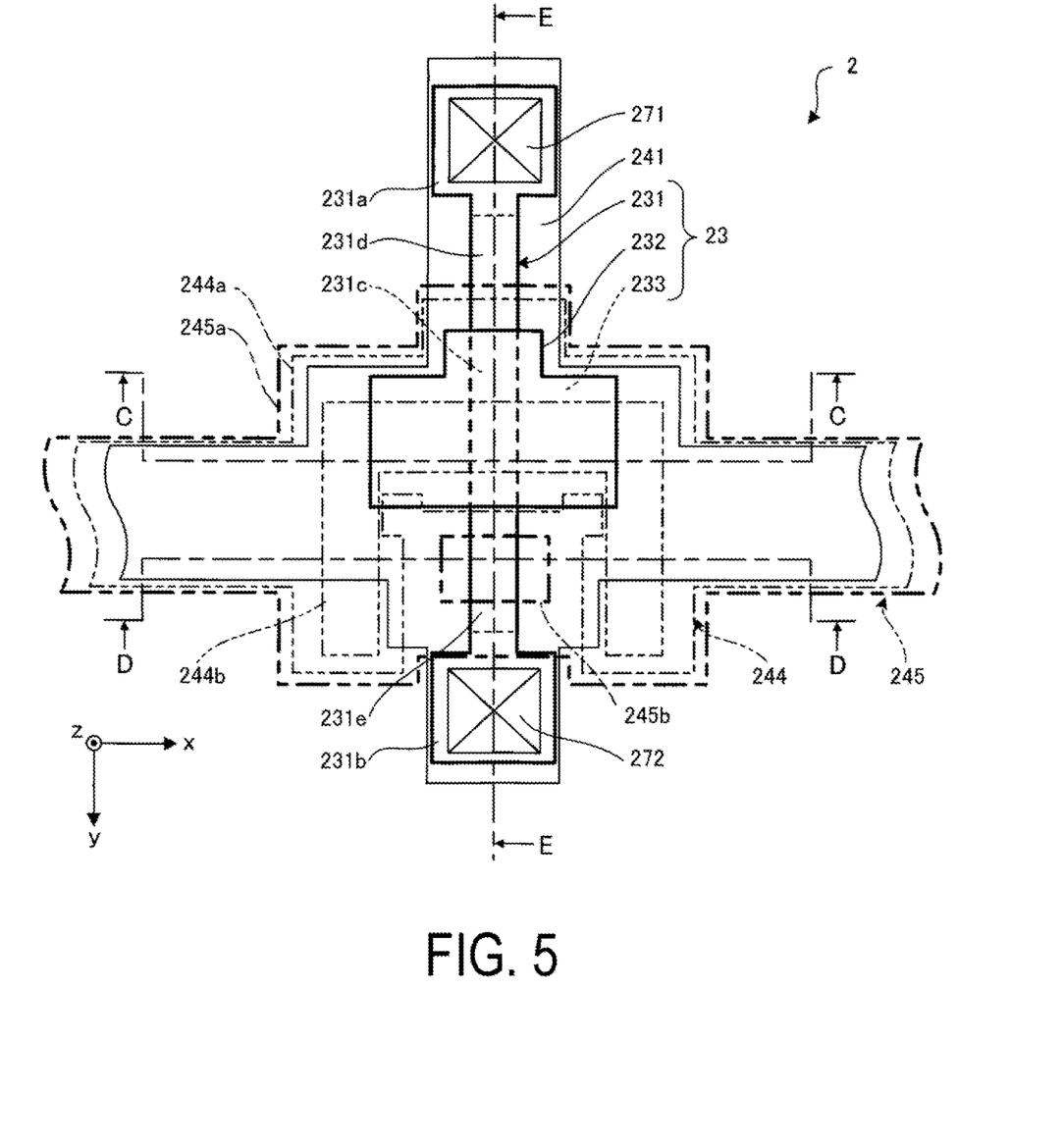
FIG. 5 is a plan view illustrating a transistor, a scanning line, and a capacitance line of the first exemplary embodiment.
Figure 6:
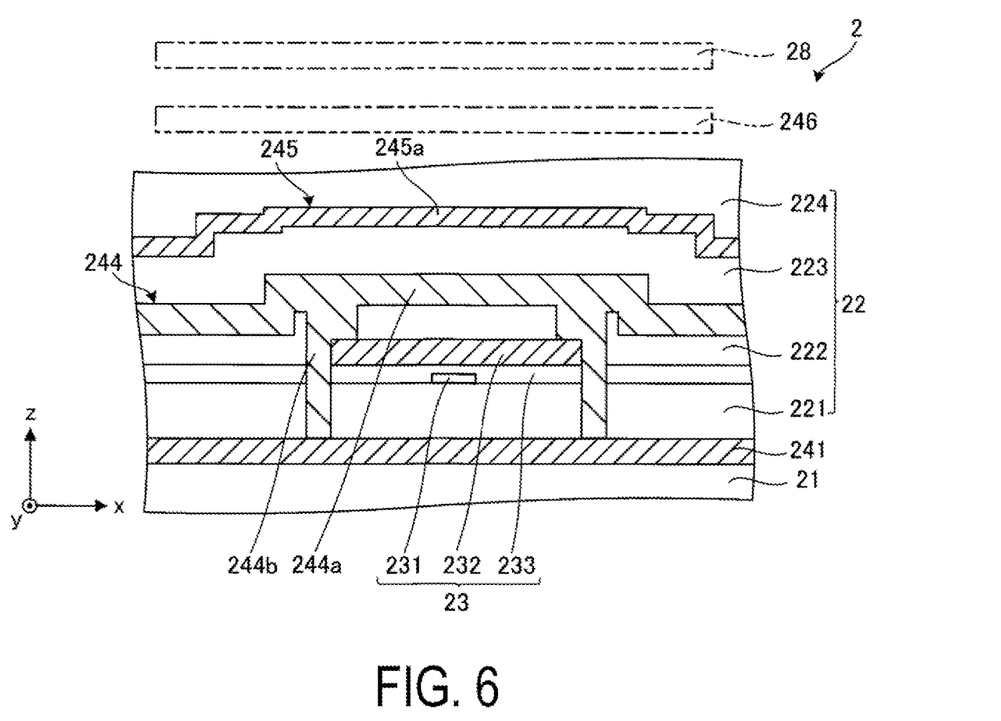
FIG. 6 is a cross-sectional view along line C-C in FIG. 5.
Figure 7:
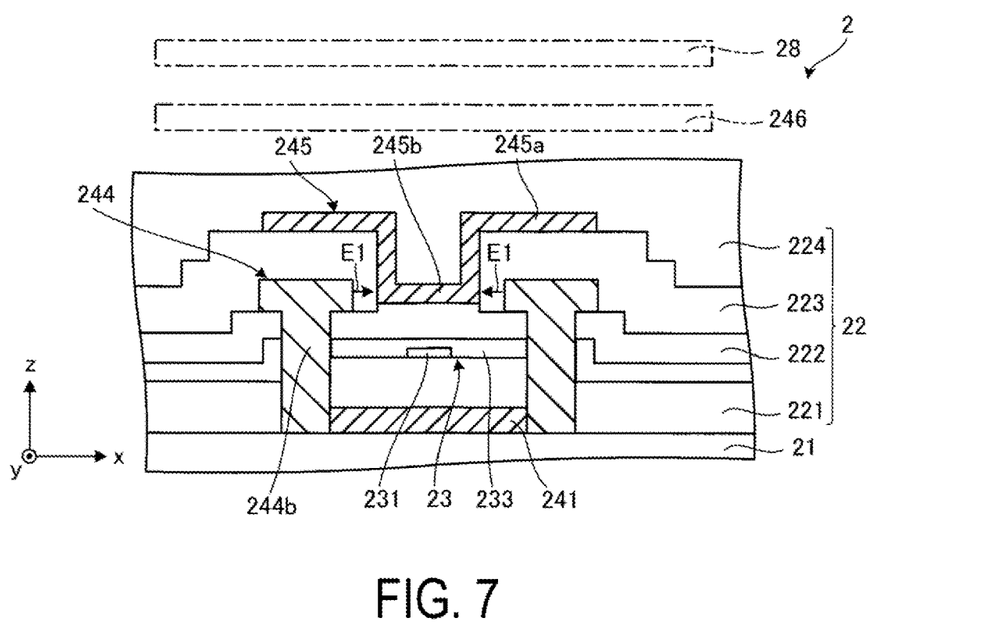
FIG. 7 is a cross-sectional view along line D-D in FIG. 5.
Figure 8:
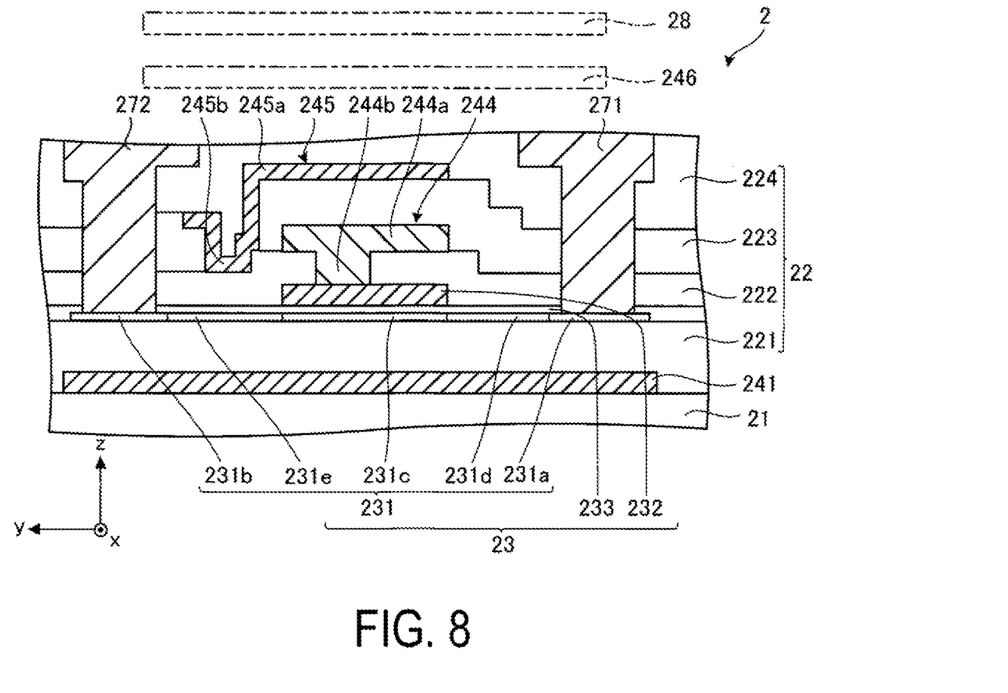
FIG. 8 is a cross-sectional view along line E-E in FIG. 5.

FIG. 5 is a plan view illustrating the transistor 23, the scanning line 244, and the capacitance line 245 of the first exemplary embodiment. FIG. 6 is a cross-sectional view along line C-C in FIG. 5. FIG. 7 is a cross-sectional view along line D-D in FIG. 5. FIG. 8 is a cross-sectional view along line E-E in FIG. 5. The element substrate 2 in these drawings includes the base material 21, a dielectric body 22, the plurality of transistors 23, a light-shielding body 241, the plurality of scanning lines 244, the plurality of capacitance lines 245, the plurality of signal lines 246, and the plurality of pixel electrodes 28. Each portion of the element substrate 2 is sequentially described below. Note that, while the element substrate 2 also includes the plurality of storage capacitors 20 and the alignment film 29 as described above, these are not illustrated in FIG. 6 to FIG. 8. Further, in FIG. 6 to FIG. 8, the configuration on the pixel electrode 28 side of the capacitance line 245 is not illustrated as appropriate, and illustrations of the signal line 246 and the pixel electrode 28 are simplified.

The base material 21 illustrated in FIG. 6 to FIG. 8 is a flat plate formed using, for example, glass or quartz. A plurality of the light-shielding bodies 241 are arranged on the surface of the base material 21, on the pixel electrode 28 side. The plurality of light-shielding bodies 241 overlap the transistor 23 and are arranged in a matrix pattern in plan view. In the exemplary embodiment, the light-shielding body 241 not only has a light shielding property, but also conductivity. The light-shielding body 241 is coupled to the scanning line 244 as described later, and also functions as a gate electrode in coordination with a gate electrode 232 of the transistor 23 described later. Examples of the constituent materials of the light-shielding body 241 include a metal such as tungsten (W), titanium (Ti), chromium (Cr), iron (Fe), and aluminum (Al), an alloy, a metal silicide, or the like.

Note that the light-shielding body 241 may function as a gate electrode. In this case, the light-shielding body 241 may be formed of a material having an insulating property. Further, the light-shielding body 241 may be arranged in a recessed portion provided to the base material 21. The recessed portion is formed by a damascene method, for example. Further, in this specification, light shielding property refers to a light shielding property with respect to visible light, and specifically a transmittance of visible light is 10% or less, and may be 5% or less.

Further, the dielectric body 22 is arranged on the surface of the base material 21 on the pixel electrode 28 side, covering the plurality of the light-shielding bodies 241. Here, the dielectric body 22 is arranged between the base material 21 and the plurality of pixel electrodes 28. The dielectric body 22 includes a plurality of insulating layers 221, 222, 223, 224, and these layers are arranged side-by-side from the base material 21 side to the pixel electrode 28 side, in this order. These layers are respectively constituted of a silicon oxide film formed by thermal oxidation, chemical vapor deposition (CVD), or the like, for example. Here, the insulating layer 222 is a first layer having an insulating property arranged between the pixel electrode 28 and the gate electrode 232 of the transistor 23 described later. The insulating layer 223 is a second layer having an insulating property arranged between the pixel electrode 28 and the insulating layer 222. The insulating layer 224 is a third layer having an insulating property arranged between the pixel electrode 28 and the insulating layer 223.

The plurality of transistors 23 are arranged between the insulating layer 221 and the insulating layer 222. The plurality of scanning lines 244 are arranged between the insulating layer 222 and the insulating layer 223. The plurality of capacitance lines 245 are arranged between the insulating layer 223 and the insulating layer 224. Although not illustrated, in the dielectric body 22, the plurality of insulating layers are also arranged on the pixel electrode 28 side of the insulating layer 224, and the storage capacitor 20 and the signal line 246 described above are arranged as appropriate between these layers.

As illustrated in FIG. 6 to FIG. 8, the transistor 23 includes a semiconductor layer 231, the gate electrode 232, and a gate insulating film 233.

The semiconductor layer 231 is arranged on the insulating layer 221. The semiconductor layer 231 includes a source area 231a, a drain area 231b, a channel area 231c, a first Lightly Doped Drain (LDD) area 231d, and a second LDD area 231e. The source area 231a functions as a source electrode. The drain area 231b functions as a drain electrode. The channel area 231c is positioned between the source area 231a and the drain area 231b. The first LDD area 231d is positioned between the channel area 231c and the source area 231a. The second LDD area 231e is positioned between the channel area 231c and the drain area 231b. The semiconductor layer 231 is, for example, formed by film deposition of polysilicon, and is doped with impurities that increase conductivity in areas excluding the channel area 231c. Here, an impurity concentration in the first LDD area 231d and the second LDD area 231e is lower than an impurity concentration in the source area 231a and the drain area 231b. Note that at least one of the first LDD area 231d and the second LDD area 231e, in particular, the first LDD area 231d, may be omitted. Further, a contact unit 271 described later may be treated as a "source electrode" and a contact unit 272 may be treated as a "drain electrode".

The gate electrode 232 overlaps with the channel area 231c of the semiconductor layer 231 described above, in plan view. The gate electrode 232 is, for example, formed by film deposition of polysilicon, and doped with impurities that increase conductivity. The gate insulating film 233 is interposed between the gate electrode 232 and the channel area 231c. The gate insulating film 233, similar to the layers constituting the dielectric body 22, is constituted of a silicon oxide film formed by thermal oxidation, CVD, or the like, for example. Note that the constituent material of the gate electrode 232 may be a metal material, such as aluminum or titanium, for example.

The source area 231a of the transistor 23 described above is coupled to the contact unit 271 electrically coupled to the signal line 246. The drain area 231b is coupled to the contact unit 272 electrically coupled to the storage capacitor 20 and the pixel electrode 28. The gate electrode 232 is coupled to the scanning line 244.

The scanning line 244 includes a wiring portion 244a and a wall portion 244b. The wiring portion 244a is arranged between the insulating layer 222 and the insulating layer 223, and extends in the x axis direction as described above. Here, the wiring portion 244a, as illustrated in FIG. 5, overlaps with the gate electrode 232 in plan view. Further, the wiring portion 244a does not overlap with the second LDD area 231e described above in plan view. As a result, even a distance between the wiring portion 244a and the transistor 23 is decreased, it is possible to reduce that a leakage electric field E1 from the wiring portion 244a acts on the second LDD area 231e. Note that when the distance between the wiring portion 244a and the transistor 23 is decreased, a light-shielding function of the scanning line 244 described later can be enhanced.

As illustrated in FIG. 6 and FIG. 7, the wall portion 244b penetrates the insulating layer 222, and couples the wiring portion 244a and the gate electrode 232. As a result, the wall portion 244b functions as a contact unit that electrically couples the scanning line 244 and the gate electrode 232. Further, the wall portion 244b penetrates the insulating layers 221, 222, and couples the wiring portion 244a and the light-shielding body 241. As a result, the wall portion 244b functions as a contact unit that electrically couples the scanning line 244 and the light-shielding body 241. Furthermore, the wall portion 244b, as illustrated in FIG. 5, forms a shape surrounding a periphery of the second LDD area 231e excluding one direction oriented toward the drain area 231b side in plan view.

Here, the scanning line 244 has a light shielding property. As a result, the scanning line 244 has a function of preventing light from outside the element substrate 2 from being made incident on the transistor 23. This function is also referred to as the "light-shielding function of the scanning line 244". In the present exemplary embodiment, by that the wall portion 244b forms a shape surrounding the second LDD region 231e in plan view as described above, it possible to reduce the amount of light made incident on the second LDD area 231e compared to a case where the wall portion 244b is not included.

The constituent materials of the scanning line 244 are not particularly limited as long as the materials have conductivity and a light shielding property, and examples include a metal such as tungsten (W), titanium (Ti), chromium (Cr), iron (Fe), and aluminum (Al), an alloy, a metal silicide, or the like. In particular, the scanning line 244 may be made of a metal. In this case, the light shielding property and conductivity of the scanning line 244 can be enhanced compared to a case where the scanning line 244 is composed of a non-metal such as polysilicon.

As described above, to reduce that the leakage electric field E1 from the wiring portion 244a acts on the second LDD area 231e, the wiring portion 244a of the scanning line 244 does not overlap with the second LDD area 231e described above in plan view. As a result, a first problem where light travel from the pixel electrode 28 side of the element substrate 2 to the transistor 23 can not be adequately prevented exists in the scanning line 244 only. Further, the effect of reducing the light made incident on the second LDD area 231e is enhanced as the distance between the wall portion 244b and the transistor 23 described above is decreased. However, when the distance is simply decreased, a second problem where the leakage electric field E1 from the wall portion 244b becomes easy to acts on the transistor 23 exists.

Here, to solve these problems, the capacitance line 245 serving as an example of the wiring includes a first portion 245a and a second portion 245b as described below. The first portion 245a is arranged between the insulating layer 223 and the insulating layer 224, and extends in the x axis direction as described above. Here, the first portion 245a includes a portion overlapping with the gate electrode 232 of the transistor 23 described above in plan view. In the present exemplary embodiment, the first portion 245a has substantially the same shape as the scanning line 244 described above in plan view, and overlaps with the scanning line 244.

As illustrated in FIG. 7 and FIG. 8, the second portion 245b is arranged closer to the insulating layer 222 than the first portion 245a. More specifically, the second portion 245b penetrates the insulating layer 223, and is arranged on the insulating layer 222 of the dielectric body 22. Note that the recessed portion may be formed in the insulating layer 222, and the second portion 245b may be arranged in an interlayer on the transistor 23 side of the scanning line 244. Furthermore, the second portion 245b may be arranged on a bottom of the recessed portion formed in the insulating layer 222. Further, the second portion 245b includes a portion overlapping with an area between the gate electrode 232 and the drain area 231b in plan view. More specifically, the second portion 245b overlaps with the second LDD area 231e in plan view. Thus, the distance between the second portion 245b and the transistor 23 can be decreased.

Further, as described above, the scanning line 244 is arranged in the same interlayer as the second portion 245b of the dielectric body 22. That is, the scanning line 244 is arranged between the insulating layer 222 and the insulating layer 223. Here, the second portion 245b is separated from the scanning line 244 in plan view. As a result, even the capacitance line 245 is a wiring having a potential different from that of the scanning line 244, the second portion 245b can be arranged in the same interlayer as the scanning line 244. Further, with the scanning line 244 arranged in the same interlayer as the second portion 245b of the dielectric body 22, the scanning line 244 can be brought closer to the gate electrode 232. As a result, it is possible to enhance the effect of shielding the transistor 23 from light by using the scanning line 244.

Here, the capacitance line 245 has a light shielding property. As a result, the capacitance line 245 has a function of preventing light from outside the element substrate 2 from being made incident on the transistor 23. This function is also referred to as the "light-shielding function of the capacitance line 245". In the present exemplary embodiment, the second portion 245b of the capacitance line 245 is positioned in the same interlayer as the scanning line 244, thus it is possible to enhance the light-shielding function of the capacitance line 245. Further, the second portion 245b overlaps with the second LDD area 231e in plan view, thus it is possible to solve the first problem described above.

Further, a fixed potential such as a ground potential, for example, is applied to the capacitance lines 245 as a reference potential, as described above. Thus, the second portion 245b is coupled to the reference potential. As a result, even the second portion 245b is brought closer to the transistor 23, problems such as that which occurs when the scanning line 244 is brought closer to the transistor 23 will not occur. Further, the second portion 245b is arranged so as to enter between the wall portion 244b of the scanning line 244 described above. As a result, by that the second portion 245b functions as an electromagnetic shield, it is possible to solve the second problem described above.

The constituent materials of the capacitance line 245, similar to the constituent materials of the scanning line 244 described above, are not particularly limited as long as the materials have conductivity and a light shielding property, and examples include a metal such as tungsten (W), titanium (Ti), chromium (Cr), iron (Fe), and aluminum (Al), an alloy, a metal silicide, or the like. In particular, the capacitance line 245 may be made of a metal. In this case, the light shielding property and conductivity of the capacitance line 245 can be enhanced compared to a case where the capacitance line 245 is composed of a non-metal such as polysilicon.

The electro-optical device 1 described above includes the base material 21, the signal line 246, the scanning line 244, the pixel electrode 28, the transistor 23, the insulating layer 222 serving as the first layer having an insulating property, the insulating layer 223 serving as the second layer having an insulating property, the insulating layer 224 serving as the third layer having an insulating property, and the capacitance line 245 serving as the wiring including the first portion 245a and the second portion 245b, as described above.

Here, the transistor 23 includes the gate electrode 232 electrically coupled to the scanning line 244, the source area 231a serving as the source electrode electrically coupled to the signal line 246, and the drain area 231b serving as the drain electrode electrically coupled to the pixel electrode 28. The insulating layer 222 is arranged between the pixel electrode 28 and the gate electrode 232. The insulating layer 223 is arranged between the pixel electrode 28 and the insulating layer 222. The insulating layer 224 is arranged between the pixel electrode 28 and the insulating layer 223.

In particular, the first portion 245a of the capacitance line 245 is arranged between the insulating layer 223 and the insulating layer 224, and overlaps the gate electrode 232 in plan view from the thickness direction of the base material 21. As a result, the capacitance line 245 can be set to a stable potential different from that of the scanning line 244. Further, the second portion 245b of the capacitance line 245 is arranged closer to the insulating layer 222 than the first portion 245a, and overlaps with the area between the gate electrode 232 and the drain area 231b in plan view. As a result, it is possible to reduce the light made incident on the transistor 23 using the second portion 245b. Further, the potential of the second portion 245b is also a potential stabilized in the same manner as that of the first portion 245a and thus, even the second portion 245b is brought closer to the transistor 23, the electric field E1 from the second portion 245b does not affect the operation of the transistor 23.

In the present exemplary embodiment, the capacitance line 245 is coupled to the reference potential. Thus, the capacitance line 245 can be used as an electromagnetic shield for the transistor 23.

Further, as described above, the transistor 23 includes the semiconductor layer 231 configured using a semiconductor. The semiconductor layer 231 includes the source area 231a constituting the source electrode, the drain area 231b constituting the drain electrode, the channel area 231c arranged between the source area 231a and the drain area 231b, and the second LDD area 231e serving as the LDD area arranged between the drain area 231b and the channel area 231c. The second portion 245b overlaps with the second LDD 231e in plan view. By arranging the second portion 245b arranged in this manner, the second LDD area 231e can be shielded from light by the second portion 245b. As a result, it is possible to reduce the light leakage of the second LDD area 231e.

Note that the second portion 245b may include a portion overlapping with an area between the gate electrode 232 and the drain area 231a in plan view. That is, in the present exemplary embodiment, while the second portion 245b overlaps the second LDD 231e in plan view, the effect described above is achieved even the second portion 245b overlaps with the first LDD region 231d in plan view. However, shielding the second LDD area 231e from light easily obtains a higher effect than shielding the first LDD area 231d from light.

1-2. Second Exemplary Embodiment

Next, a second exemplary embodiment of the present disclosure will be described. The present exemplary embodiment is the same as the first exemplary embodiment other than the potential of the wiring included in the first portion and the second portion is different. Note that the description below focuses on the differences of the second exemplary embodiment from the first exemplary embodiment, and thus descriptions related to similar items are omitted. Further, in FIG. 9, components that are the same as those in the first exemplary embodiment are denoted by using the same reference numerals.

Figure 9:
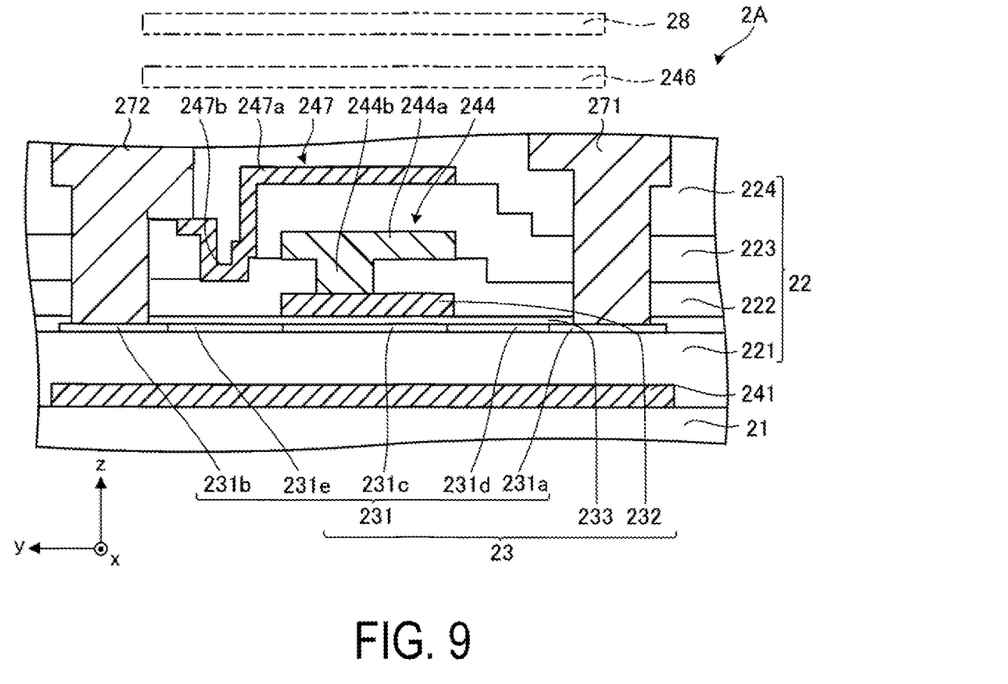
FIG. 9 is a cross-sectional view illustrating the transistor, the scanning line, and the capacitance line of a second exemplary embodiment.

FIG. 9 is a cross-sectional view illustrating the transistor, the scanning line, and the capacitance line of the second exemplary embodiment. An element substrate 2A illustrated in FIG. 9 includes a wiring 247 electrically coupled to the drain area 231b via the contact unit 272. Note that, while not illustrated in FIG. 9, the element substrate 2A includes a capacitance line arranged in an interlayer different from that of the wiring 247.

The wiring 247 includes a first portion 247a and a second portion 247b. The first portion 247a, similar to the first portion 245a in the first exemplary embodiment described above, is arranged between the insulating layer 223 and the insulating layer 224, and includes a portion overlapping with the gate electrode 232 of the transistor 23 described above, in plan view. The second portion 247b, similar to the second portion 245b in the first exemplary embodiment described above, is arranged between the insulating layer 222 and the layer in which the insulating layer 223 is arranged, and includes a portion overlapping with an area between the gate electrode 232 and the drain area 231b, in plan view. Note that the wiring 247 may be formed in the same layer as the contact unit 272.

According to the second exemplary embodiment described above as well, the same effect as those of the first exemplary embodiment described above can be obtained. Further, in the present exemplary embodiment, the wiring 247 has the same potential as the drain area 231b. As a result, compared to a case where the wiring 247 is coupled to the reference potential, the configuration of the routing of the wiring and the like can be simplified.

2. Electronic Apparatus

The electro-optical device 1 can be used for various electronic apparatuses.

Figure 10:
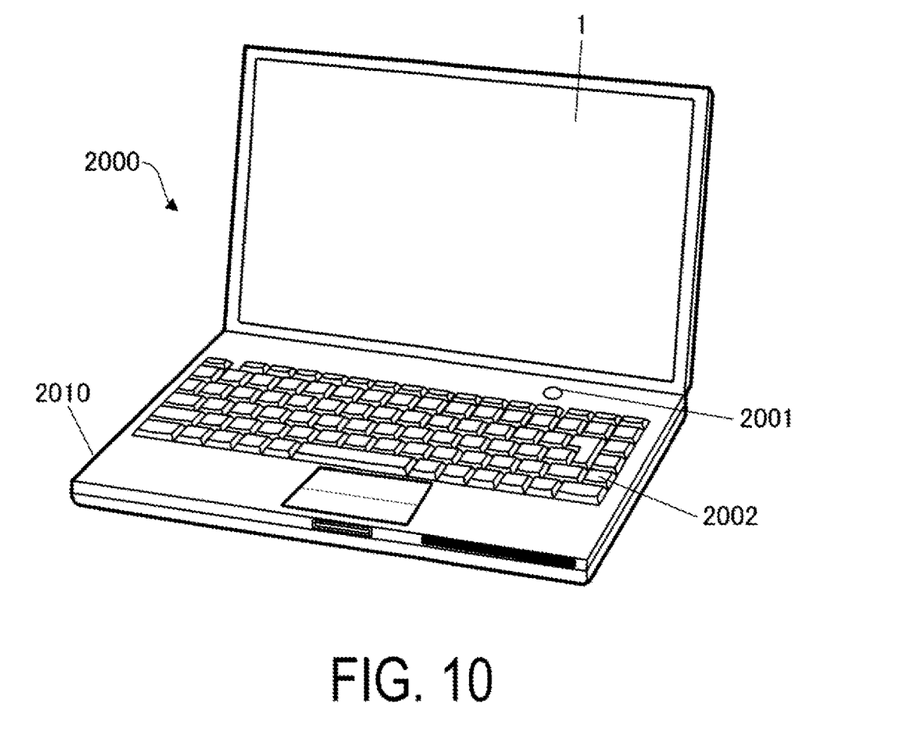
FIG. 10 is a perspective view illustrating a personal computer as one example of an electronic apparatus.

FIG. 10 is a perspective view illustrating a personal computer as one example of an electronic apparatus. A personal computer 2000 includes the electro-optical device 1 that displays various images, and a main body unit 2010 provided with a power source switch 2001 and a keyboard 2002.

Figure 11:
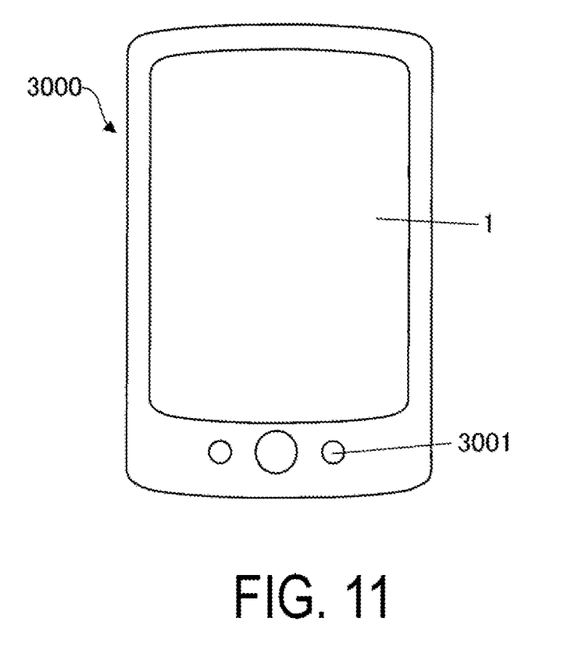
FIG. 11 is a perspective view illustrating a smartphone as one example of the electronic apparatus.

FIG. 11 is a perspective view illustrating a smartphone as one example of the electronic apparatus. A smartphone 3000 includes an operation button 3001, and the electro-optical device 1 that displays various images. The screen contents displayed on the electro-optical device 1 are changed in accordance with an operation of the operation button 3001.

Figure 12:
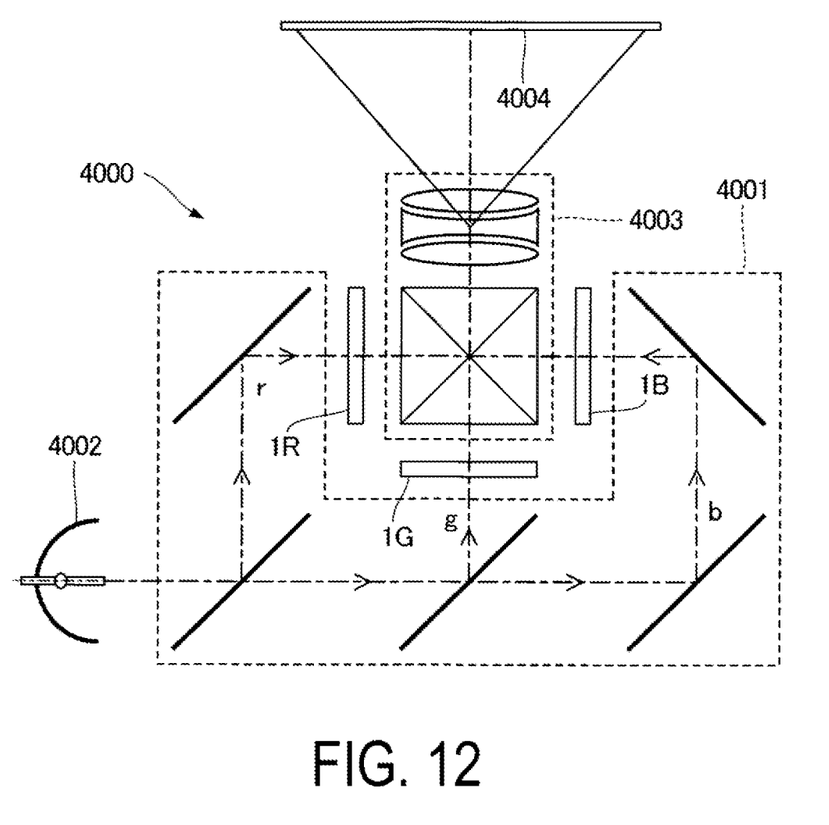
FIG. 12 is a schematic view illustrating a projector as one example of the electronic apparatus.

FIG. 12 is a schematic view illustrating a projector as one example of the electronic apparatus. A projection-type display apparatus 4000 is a three-plate type projector, for example. An electro-optical device 1R is the electro-optical device 1 corresponding to a red display color, an electro-optical device 1G is the electro-optical device 1 corresponding to a green display color, and an electro-optical device 1B is the electro-optical device 1 corresponding to a blue display color. That is, the projection-type display apparatus 4000 includes the three electro-optical devices 1R, 1G, 1B respectively corresponding to red, green, and blue display colors.

An illumination optical system 4001 supplies a red color component r of light emitted from a lighting apparatus 4002 serving as a light source to the electro-optical device 1R, supplies a green color component g of the light to the electro-optical device 1G, and supplies a blue color component b of the light to the electro-optical device 1B. Each electro-optical device 1R, 1G, 1B functions as an optical modulator of a light valve or the like that modulates each monochromatic light in accordance with a display image, the monochromatic light being supplied from the illumination optical system 4001. A projection optical system 4003 combines the light emitted from each of electro-optical devices 1R, 1G, 1B, and projects the combined light to a projection surface 4004.

The personal computer 2000, the smartphone 3000, and the projection-type display apparatus 4000 described above each include the electro-optical device 1 described above. As a result, the display quality of the personal computer 2000, the smartphone 3000, and the projection-type display apparatus 4000 can be enhanced.

Note that examples of the electronic apparatus to which the present disclosure is applied are not limited to the illustrated apparatuses, and may include, for example, a personal digital assistant (PDA), a digital still camera, a television, a video camera, a car navigation system, an indicator for a vehicle, an electronic notebook, an electronic paper, a calculator, a word processor, a workstation, a visual telephone, and a Point of sale (POS) terminal, or the like. Furthermore, examples of the electronic apparatus to which the present disclosure is applied include a printer, a scanner, a copier, a video player, devices provided with a touch panel, and the like.

While the above has described the electro-optical device and the electronic apparatus according to the present disclosure based on preferred exemplary embodiments, the present disclosure is not limited to the exemplary embodiments described above. Further, the configuration of each component of the present disclosure may be replaced with any configuration that exerts the equivalent functions of the above-described exemplary embodiments, and to which any configuration may be added.

Further, in the explanation described above, the liquid crystal device was described as an example of the electro-optical device of the present disclosure, but the electro-optical device of the present disclosure is not limited to the liquid crystal device. That is, the electro-optical device need only be an electro-optical device in which the optical characteristics change according to the electric power. For example, the present disclosure may also be applied in the same manner as the exemplary embodiment described above to a display panel that uses a light emitting element such as organic electroluminescence (EL), inorganic EL, or a light emitting polymer.

Further, the present disclosure may also be applied in the same manner as the exemplary embodiment described above to an electrophoretic display panel that uses a microcapsule including a pigmented liquid and white particles dispersed in the liquid.

Further, while the description above used the TFT as an example of the transistor, the transistor is not limited to the TFT, and may be a metal-oxide-semiconductor field-effect transistor (MOSFET) or the like, for example.

Further, the electro-optical device of the present disclosure is not limited to a transmissive type, and may be a reflective type.

What is claimed is:

1. An electro-optical device comprising:
   a base material;
   a signal line;
   a scanning line;
   a pixel electrode;
   a transistor including a gate electrode electrically coupled to the scanning line, a source electrode electrically coupled to the signal line, and a drain electrode electrically coupled to the pixel electrode;
   a first layer having an insulating property and arranged between the pixel electrode and the gate electrode;
   a second layer having an insulating property and arranged between the pixel electrode and the first layer;
   a third layer having an insulating property and arranged between the pixel electrode and the second layer; and
   a wiring including a first portion arranged between the second layer and the third layer and overlapping with the gate electrode in plan view from a thickness direction of the base material, and a second portion arranged closer to the first layer than the first portion and overlapping with an area between the gate electrode and the source electrode or the drain electrode in the plan view.

2. The electro-optical device according to claim 1, wherein the wiring has a same potential as the drain electrode.

3. The electro-optical device according to claim 1, wherein the wiring is coupled to a reference potential.

4. The electro-optical device according to claim 1, wherein
   the scanning line is arranged between the first layer and the second layer, and
   the second portion is separated from the scanning line in the plan view.

5. The electro-optical device according to claim 1, wherein
   the transistor includes a semiconductor layer constituted using a semiconductor,
   the semiconductor layer includes a source area constituting the source electrode, a drain area constituting the drain electrode, a channel area arranged between the source area and the drain area, and an LDD area arranged between the drain area and the channel area, and
   the second portion overlaps with the LDD area in the plan view.

6. The electro-optical device according to claim 1, wherein
   the wiring is composed of a metal.

7. The electro-optical device according to claim 1, wherein
   the scanning line is composed of a metal.

8. An electronic apparatus comprising the electro-optical device according to claim 1.

* * * * *